United States Patent [19]

West et al.

[11] Patent Number: 5,691,688

[45] Date of Patent: Nov. 25, 1997

[54] PTC DEVICE

[75] Inventors: Jeffrey A. West, Bellville; Robert L. Newman, Mansfield, both of Ohio

[73] Assignee: Therm-O-Disc, Incorporated, Mansfield, Ohio

[21] Appl. No.: 277,761

[22] Filed: Jul. 20, 1994

[51] Int. Cl.[6] .................................................. H01C 7/10
[52] U.S. Cl. ........................ 338/22 R; 338/220; 338/221
[58] Field of Search .......................... 338/22 R, 22 SD, 338/77, 182, 185, 219, 220, 221, 223, 315

[56] References Cited

U.S. PATENT DOCUMENTS

| | | | |
|---|---|---|---|
| 3,718,881 | 2/1973 | Szanny | 338/22 R |
| 4,810,211 | 3/1989 | Hutnak et al. | 338/219 |
| 4,831,354 | 5/1989 | Yagher | 338/22 R |
| 4,937,551 | 6/1990 | Plasko | 338/22 R |
| 5,142,265 | 8/1992 | Motoyoshi et al. | 338/22 R |
| 5,233,326 | 8/1993 | Motoyoshi | 338/220 |
| 5,280,263 | 1/1994 | Sugaya | 338/22 R |
| 5,451,921 | 9/1995 | Crawford et al. | 338/220 |

*Primary Examiner*—Tu B. Hoang
*Attorney, Agent, or Firm*—Jones, Day, Reavis & Pogue

[57] ABSTRACT

A PTC device having a PTC material sandwiched between a pair of metal plates includes a plurality of spaced-apart legs extending outwardly from the plates for reception in circuit board slots. Certain legs terminate in transverse hook portions for retaining same in a circuit board slot.

20 Claims, 4 Drawing Sheets

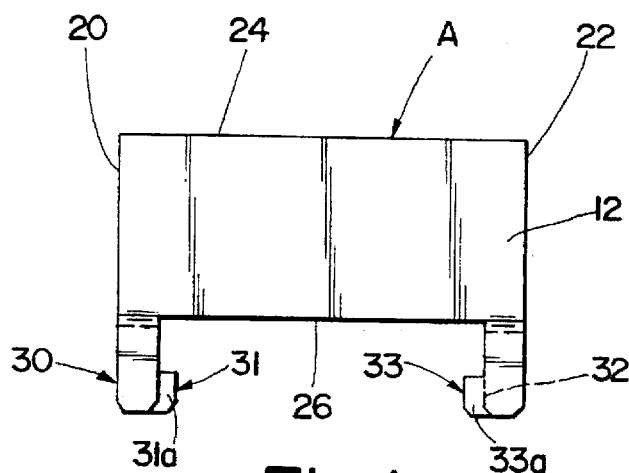
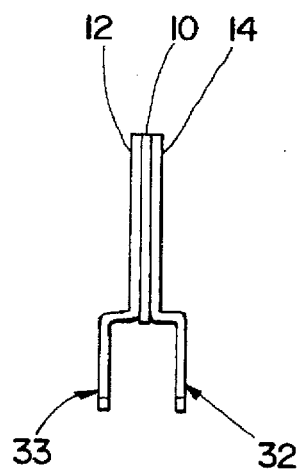
Fig. 1
Fig. 2
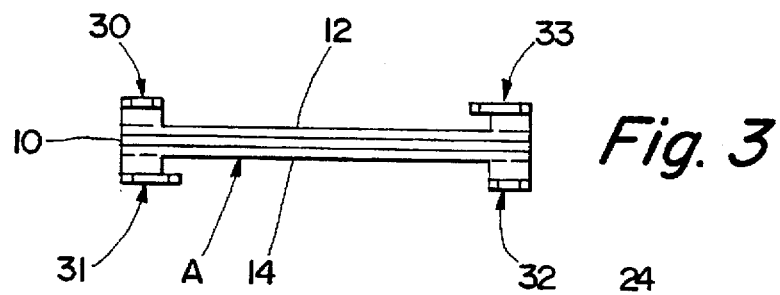
Fig. 3
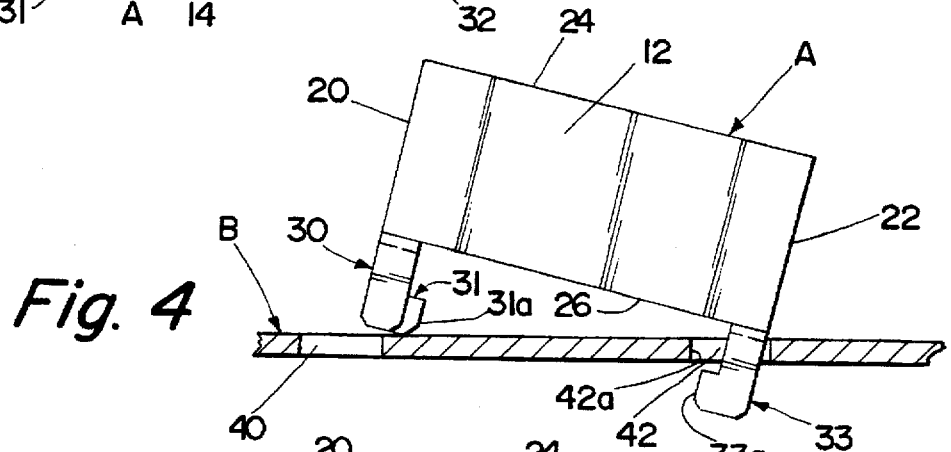
Fig. 4
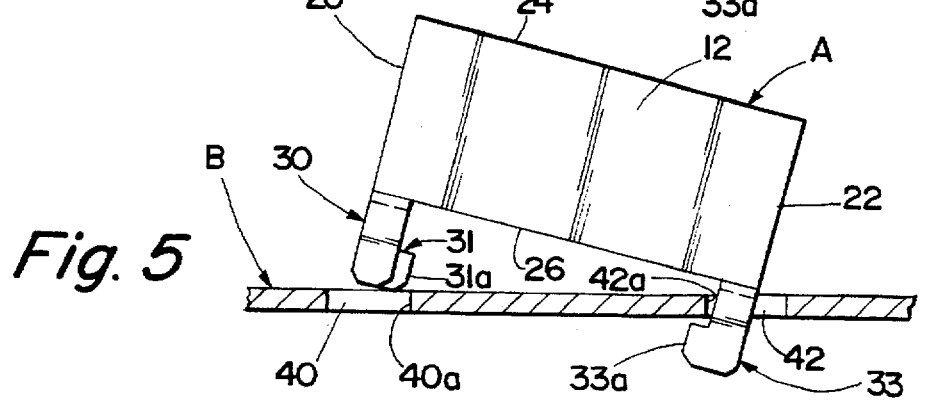
Fig. 5

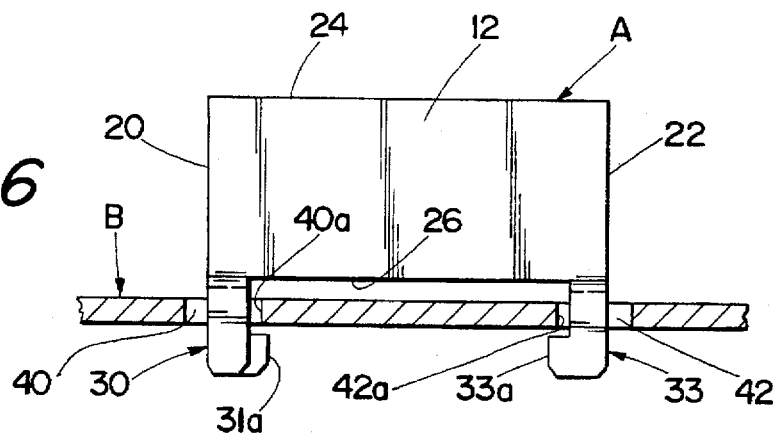
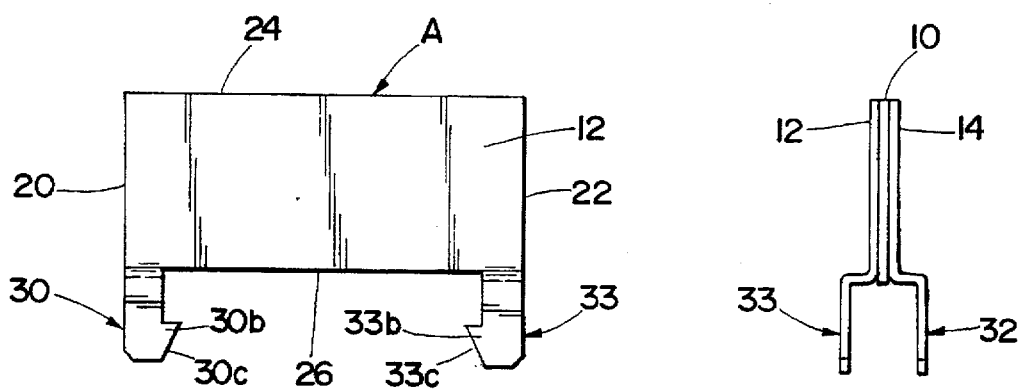
Fig. 6
Fig. 7
Fig. 8
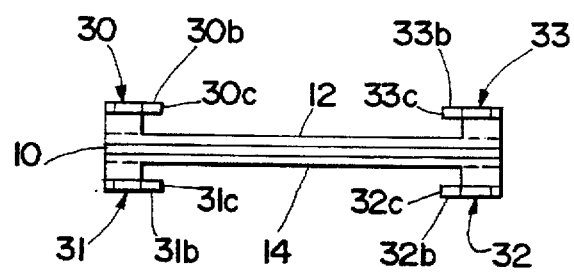
Fig. 9
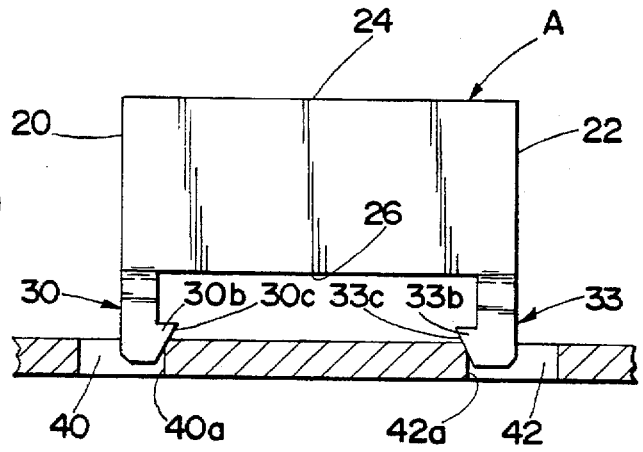
Fig. 10

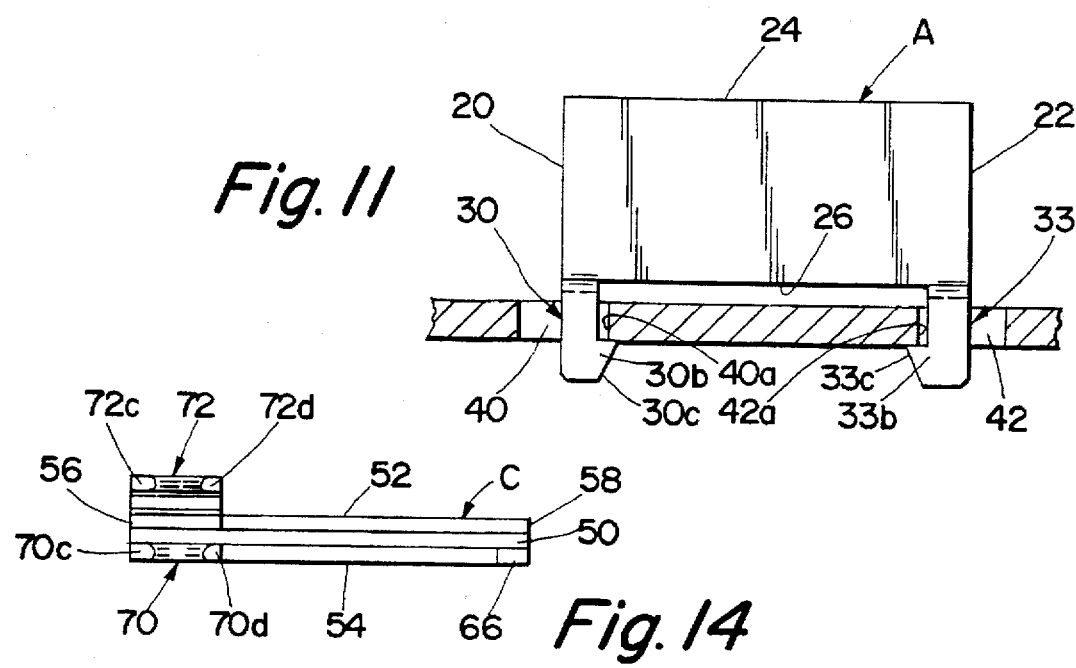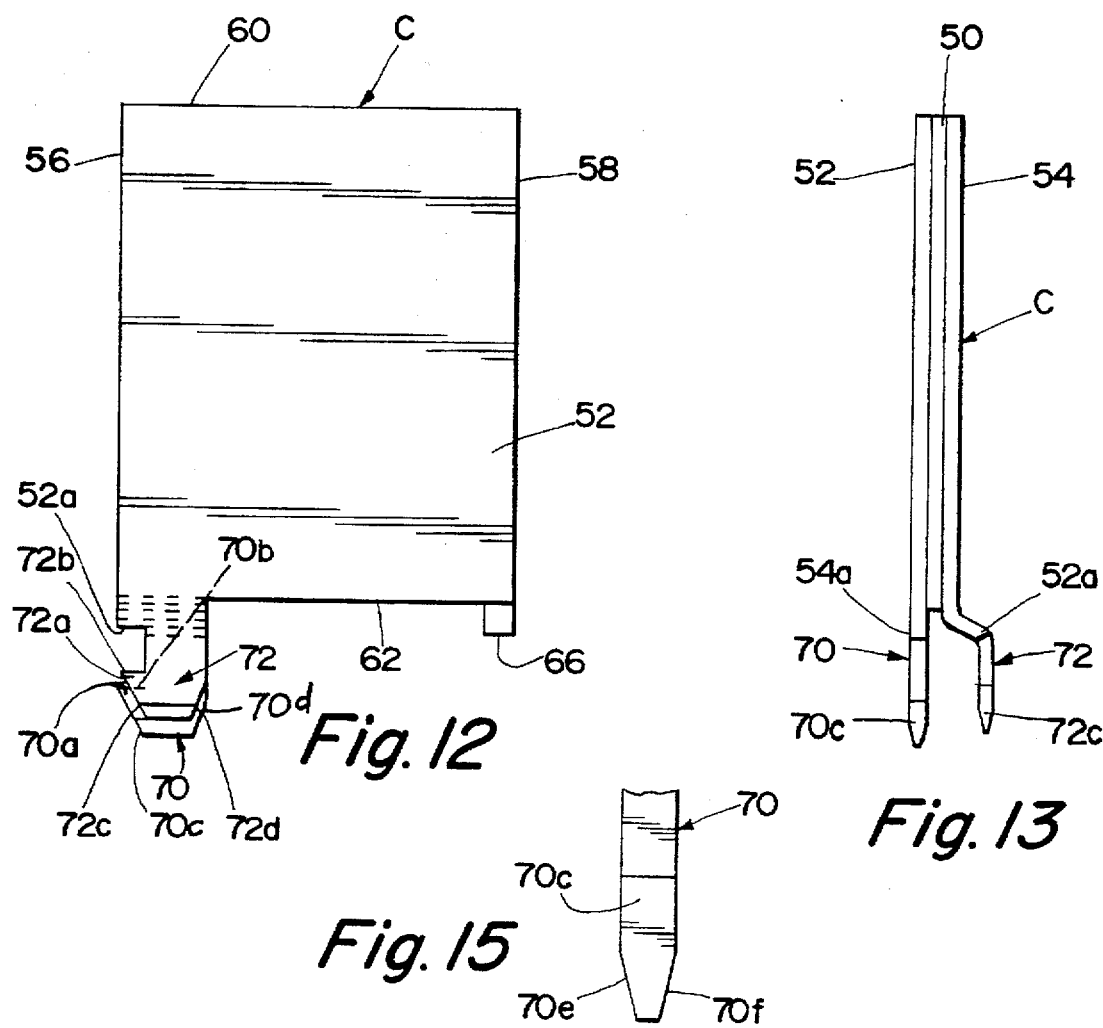

5,691,688

1

PTC DEVICE

BACKGROUND OF THE INVENTION

This application relates to the art of electrical resistors and, more particularly, to arrangements for attaching electrical resistors to slots in circuit boards. The invention is particularly applicable to thermal protectors having a positive temperature coefficient of resistance and will be described with specific reference thereto. However, it will be appreciated that the invention has broader aspects and can be used with other electric circuit components.

Printed circuit board assemblies are commonly made by positioning electric circuit components on the board and then performing a wave soldering operation to make the electrical connections between the components and the printed circuit. During the soldering operation, components may fall out of the board. It would be desirable to have a simple arrangement for retaining circuit components on the board during the soldering operation.

SUMMARY OF THE INVENTION

An electric circuit component has a plurality of spaced-apart legs extending outwardly therefrom for reception in slots in a printed circuit board. At least certain of the legs have transversely extending hook portions that inhibit displacement of the component from the board.

In a preferred arrangement, the electric circuit component comprises a flat layer of PTC material sandwiched between a pair of flat metal plates. The legs extend outwardly from the plates generally parallel to the plate outer surfaces. The legs on opposite plates are preferably spaced-apart in a direction perpendicular to the plates a distance substantially greater than the thickness of the PTC device as measured across the outer faces of the metal plates. This enhances the stability of the PTC device once the legs are extended through slots in a printed circuit board.

The hook portions on the legs may take many forms. In one arrangement, the hook portions are on legs located adjacent opposite ends of the PTC device and extend toward one another. One leg and its hook portion is inserted through a slot and the PTC device is then shifted transversely to allow passage of the other leg and its hook portion through another slot. The PTC device is then shifted again to locate the hook portions beneath solid portions of the board.

In a more preferred arrangement, the hook portions are in the form of barbs that cut through smaller board slots. The barbs on different legs are preferably spaced different distances outwardly from the PTC device so that the barbs are forced through slots in sequence rather than simultaneously.

It is a principal object of the present invention to provide an improved arrangement for retaining electric circuit components to a printed circuit board during wave soldering.

It is another object of the invention to provide an improved PTC device having legs integrally formed therewith for retaining the device on a printed circuit board during wave soldering.

BRIEF DESCRIPTION OF THE DRAWING

FIG. 1 is a side elevational view of a PTC device constructed in accordance with the present application;

FIG. 2 is an end elevational view thereof;

FIG. 3 is a bottom view thereof;

FIGS. 4–6 show how the PTC device of FIGS. 1–3 is attached to a printed circuit board;

2

Figure 16:
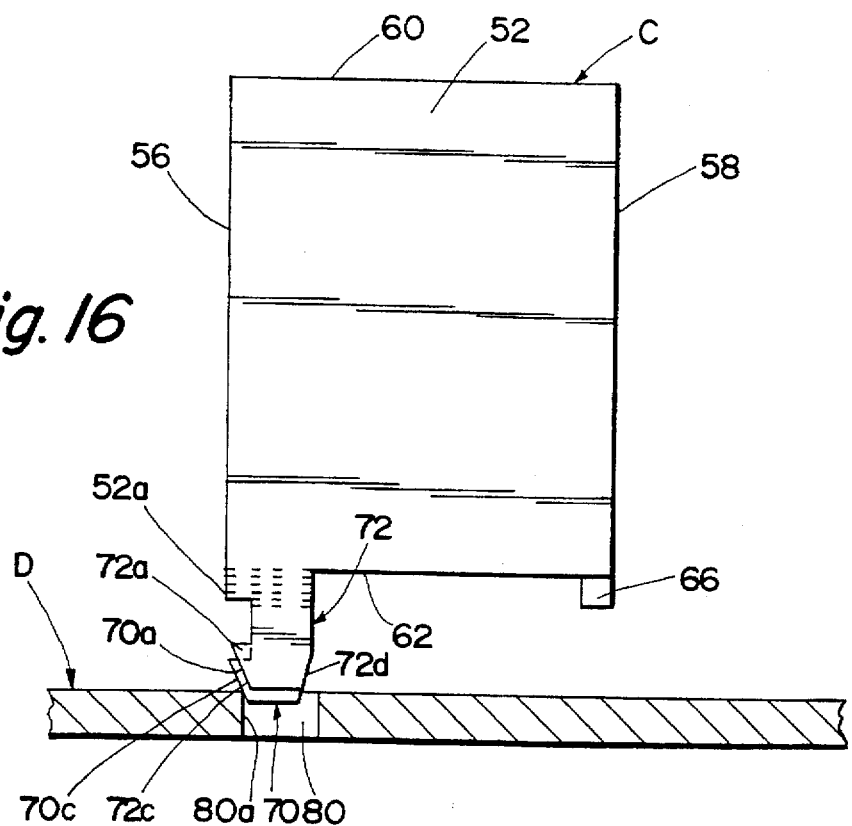
Figure 17:
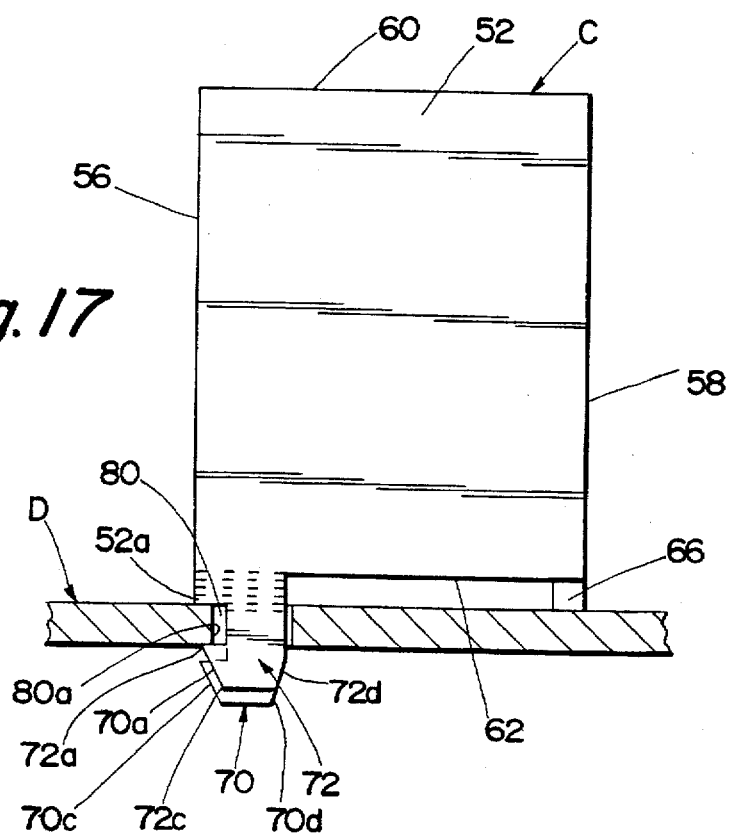

FIG. 7 is a side elevational view of another embodiment;

FIG. 8 is an end elevational view thereof;

FIG. 9 is a bottom view thereof;

FIGS. 10 and 11 illustrate the manner in which the embodiment of FIGS. 7–9 is assembled to a printed circuit board;

FIG. 12 is a side elevational view of another embodiment;

FIG. 13 is an end elevation view thereof;

FIG. 14 is a bottom view thereof;

FIG. 15 is an enlarged end elevational view of the terminal and portion of a leg; and FIGS. 16 and 17 illustrate the manner in which the embodiment of FIGS. 12–14 is assembled to a printed circuit board.

DESCRIPTION OF PREFERRED EMBODIMENTS

Referring now to the drawing, wherein the showings are for purposes of illustrating certain preferred embodiments of the invention only and not for purposes of limiting same, FIGS. 1–3 show a PTC device A comprising a central flat layer of PTC material 10 sandwiched between a pair of opposite metal plates 12,14. PTC material 10 may be of many different types and one example is a conductive polymeric plastic filled with carbon black. PTC material 10 exhibits a non-linear change in resistance with temperature. Within a certain narrow temperature range, the electrical resistance of the material jumps sharply. Materials having this positive temperature coefficient of resistance characteristic are commonly known as PTC materials. The PTC material may be customized to respond to either temperature conditions of the surrounding environment or to current overload conditions.

Flat metal plates 12,14 are bonded to PTC material 10 and define electrical terminals for the PTC device. The PTC device has opposite ends 20,22 and opposite sides 24,26. Legs 30–33 integral with plates 12,14 extend outwardly from side 26 adjacent opposite ends 20,22. The legs preferably extend outwardly transversely of plates 12,14 as shown in FIG. 2 and are then bent to extend substantially parallel to the flat outer surfaces of plates 12,14. Thus, adjacent legs on opposite plates are transversely spaced-apart a distance substantially greater than the thickness of the PTC device as measured across the outer surfaces of plates 12,14. The legs are preferably spaced-apart a distance that is at least one and one-half times the thickness of the PTC device.

In the embodiment of FIGS. 1–3, legs 30,32 are simply straight legs with chamfered end corners. Legs 31 and 33 terminate in transversely extending hook portions 31a,33a. The hook portions extend toward one another from legs located adjacent opposite ends of the PTC device. The upper surfaces of hook portions 31a,33a are spaced from side 26 a distance greater than the thickness of the printed circuit board in which the legs are positioned. The end corners of legs 31,33 are chamfered to facilitate insertion of the legs in slots in a printed circuit board.

FIGS. 4–6 illustrate the manner of positioning PTC device A on a printed circuit board B. Narrow board slots 40,42 have slot ends 40a, 42a that are spaced-apart a distance slightly greater than the distance between the facing terminal ends of leg hook portions 31a,33a. The PTC device is tilted as shown in FIG. 4 to extend hooked leg 33 through slot 42. It will be understood that leg 32 adjacent to hooked leg 33 will also be extended through an adjacent board slot at the same time. PTC device A is then shifted laterally to the left as shown in FIG. 5 to align hooked leg 31 with slot 40. PTC device A may then be rotated counterclockwise to extend hooked leg 31 through slot 40. It will be understood that straight leg 30 adjacent to hooked leg 31 will simultaneously be extended through an adjacent slot. PTC device A may then be shifted slightly back to the right so that hooked portions 31a, 33a are located beneath solid portions of board B. PTC device A is now stabilized and retained on board B against displacement during a wave soldering operation for connecting the legs with the printed circuit or with other circuit components.

FIGS. 7–9 show another embodiment wherein legs 30–33 have barbed transversely extending hook portions 30b–33b. Barbed hook portion ends 30c–33c are inclined from the terminal ends of the legs along the entire length of the barbed hook portions. The opposite outer end corners of each leg are also chamfered as shown in the drawing.

FIGS. 10 and 11 show printed circuit board B having narrow slots 40,42 therein with slot ends 40a,42a spaced-apart a distance slightly greater than the distance between the facing sharp points on barbed end portions 30b, 33b. Force is applied to PTC device A so that inclined barbed hook portion ends 30c, 33c cut and displace board material until they snap through slots 40,42 as shown in FIG. 11. Obviously, the length of slots 40,42 can be slightly less than the width of a leg and its associated barbed hook portion.

FIGS. 12–14 show another embodiment of a PTC device C having PTC material 50 sandwiched between opposite metal terminal plates 52,54 that are bonded to PTC layer 50. PTC device C has opposite ends 56,58 and opposite top and bottom sides 60,62. A small standoff leg 66 extends downwardly from plate 52 adjacent end 58 as shown in FIGS. 12 and 14. Each terminal plate 52,54 has a retaining leg 70,72 integrally formed thereon adjacent end 56. Leg 70 is straight and located in the plane of its plate 52. Leg 72 is bent to extend outwardly from its associated plate 54 and is then bent to extend substantially parallel to plate 54 as shown in FIG. 13. The spacing between legs 70,72 in a direction perpendicular to plates 52,54 is preferably at least one and one-half times the thickness of PTC device C between the outer surfaces of plates 52,54.

Legs 70,72 are spaced inwardly from end 56 of PTC device C to provide integral plate standoff projections 52a, 54a that project below bottom side 62 approximately the same distance as standoff leg 66. Each leg has a barbed hook portion 70a,72a extending transversely thereof toward end 56. Barbed hook portions 70,72 have upper surfaces 70b,72b that are spaced different distances from side bottom 62. Thus, when the barbed legs are forced through slots in a printed circuit board, the barbed hook portions snap through their slots in sequence rather than simultaneously to reduce the force required. Barbed hook portions 70a,72a have outwardly facing inclined ends 70c,72c. Legs 70,72 terminate in opposite inclined surfaces 70d,72d. FIG. 15 shows the opposite side end portions of leg 70 as being tapered inwardly toward the terminal end of the leg to facilitate insertion of the leg in a circuit board slot.

FIGS. 16 and 17 show a printed circuit board D having a slot 80 therein having a length slightly less than the total width of leg 72 and its barbed hook portion 72a. It will be recognized that board C has a corresponding slot for leg 70. The tapered terminal end portions of legs 70,72 are positioned in the board slots and downward force is applied to PTC device C. The inclined ends on the barbed hook portions of the legs cut and displace board material until they snap through the board to the general positions shown in FIG. 17. The terminal ends of standoff leg 66 and standoff projections 52a,54a engage the upper surface of board D to maintain the bottom side 62 of PTC device C spaced upwardly thereof. It will be recognized that similar standoff means for the same purpose are desirable for all embodiments. The standoff function may be served by a close friction fit of the legs in the board slots or in transversely aligned legs being spaced a greater or smaller distance than the spacing between transversely aligned slots.

Although the invention has been shown and described with respect to certain preferred embodiments, it is obvious that equivalent alterations and modifications will occur to others skilled in the art upon the reading and understanding of this specification. The present invention includes all such equivalent alterations and modifications, and is limited only by the scope of the claims.

We claim:

1. A PTC device comprising a PTC material sandwiched between a pair of metal terminal plates having outer surfaces that define opposite faces for said PTC device, said PTC device having an outer periphery that includes opposite ends and opposite sides, at least one pair of legs extending outwardly from one of said opposite sides, each leg in said pair of legs being integral with one of said metal terminal plates, one of the legs in said pair of legs being adjacent one of said opposite ends and another of the legs in said pair of legs being adjacent another of said opposite ends, at least one leg in said pair of legs terminating in a hook portion that extends in a direction between said opposite ends along said one of said sides in spaced relationship to said one of said sides, and each leg in said pair of legs being located entirely adjacent one of said opposite faces without extending over to the other of said opposite faces.

2. The PTC device of claim 1 wherein at least one of the legs in said pair of legs is bent to extend outwardly from one of said opposite faces and then being bent to extend in a direction substantially parallel to said one of said opposite faces and outwardly of said one of said opposite sides.

3. The PTC device of claim 1 wherein there are two pair of legs extending outwardly from said one of said opposite sides and each of said metal terminal plates has one pair of said two pair of legs integral therewith, said legs on said metal terminal plates being located to provide two legs adjacent each of said opposite ends, and at least one leg adjacent each of said opposite ends having a said hook portion thereon extending toward the opposite end from the end adjacent which it is located.

4. The PTC device of claim 3 wherein each leg on each of said metal terminal plates is first bent to extend outwardly from said outer surface of the metal terminal plate on which it is located and is then bent to extend substantially parallel to said outer surface of the metal terminal plate on which it is located in a direction away from said one of said opposite sides of said PTC device.

5. The PTC device of claim 1 wherein said device has a predetermined thickness between said opposite faces, and the legs in said pair of legs are spaced-apart in a direction perpendicular to said opposite faces a distance substantially greater than said predetermined thickness.

6. The PTC device of claim 1 wherein each leg in said pair of legs is on a different one of said pair of metal terminal plates.

7. The PTC device of claim 1 wherein each leg in said pair of legs is on the same one of said pair of metal terminal plates.

8. A PTC device comprising a PTC material sandwiched between a pair of metal terminal plates having outer surfaces that define opposite faces for said PTC device, said device having an outer periphery that includes opposite ends and opposite sides, each said plate having an integral leg extending outwardly therefrom along one of said sides adjacent each of said ends to provide a total of four legs that include a pair of legs adjacent each of said ends, each leg in each of said pair of legs having a first portion extending transversely outwardly from the metal terminal plate with which it is integral and having a second terminal portion extending generally parallel to the metal terminal plate with which it is integral, and at least one leg in each of said pair of legs terminating in a hook portion that extends generally parallel to said opposite faces toward another hook portion in another of said pair of legs.

9. A PTC device comprising a PTC material sandwiched between a pair of opposite terminal metal plates, a plurality of spaced-apart legs extending outwardly from at least one of said plates integrally therewith for reception in slots in a circuit board, at least one of said legs terminating in a hook portion that extends transversely of said one of said legs in outwardly-spaced relationship to the metal terminal plate with which it is integral for retaining said one of said legs in a circuit board slot.

10. The PTC device of claim 9 wherein said plates have outer surfaces and said PTC device has a thickness measured across said outer surfaces, said device having opposite ends and said legs including a pair of legs extending outwardly from said plates adjacent one of said opposite ends substantially parallel to said plates, at least one leg of said pair of legs being laterally offset outwardly so that said pair of legs are spaced-apart a distance substantially greater than said thickness of said PTC device, said pair of legs having transversely extending hook portions thereon, and said hook portions on said pair of legs being spaced outwardly different distances from said plates.

11. A PTC device comprising a PTC material sandwiched between a pair of substantially parallel flat metal plates, said plates having substantially parallel flat outer faces and said device having a predetermined thickness measured across said faces, a pair of legs projecting from said plates integrally therewith and having substantially flat terminal portions that project outwardly from said plates substantially parallel to said faces and are spaced-apart apart in the direction of said predetermined thickness a distance that is substantially greater than said predetermined thickness.

12. The PTC device of claim 11 wherein said pair of legs have terminal hook portions that extends in a direction substantially parallel to said outer faces.

13. A PTC device comprising a PTC material sandwiched between a pair of substantially parallel flat metal plates, at least one of said plates having at least one integral hooked leg extending therefrom, said leg having a flat portion that projects outwardly substantially parallel to said one of said plates and terminates in a hook portion that is spaced outwardly from said one of said plates and extends transversely of said flat portion in a direction substantially parallel to said one of said plates.

14. The PTC device of claim 13 wherein said device has opposite ends and top and bottom sides, said one hooked leg projecting from said bottom side closely adjacent one of said ends.

15. The PTC device of claim 13 wherein said one leg is first bent outwardly away from said one of said plates and is then bent to extend substantially parallel to said one of said plates to define said flat portion of said one leg.

16. A PTC device comprising a PTC material sandwiched between a pair of substantially parallel flat metal plates, said device having opposite ends and top and bottom sides, at least one hooked leg on at least one of said plates extending outwardly from said bottom side, and at least one standoff projection on at least one of said plates extending outwardly from said bottom side, said leg having a leg length and said standoff projection having a standoff projection length, and said leg length being substantially greater than said standoff projection length.

17. The PTC device of claim 16 wherein said standoff projection is closely adjacent to said leg.

18. The PTC device of claim 16 wherein said leg is located adjacent one of said ends and said projection is located adjacent another of said ends.

19. The PTC device of claim 16 including a pair of standoff projections, one standoff projection in said pair of standoff projections being located adjacent said leg and another standoff projection in said pair of standoff projections being located remote from said leg.

20. The PTC device of claim 19 wherein said one standoff projection in said pair of standoff projections is located adjacent one of said ends of said device and said another standoff projection in said pair of standoff projections is located adjacent another of said ends of said device.

* * * * *